United States Patent
Zhou et al.

(10) Patent No.: US 8,314,033 B2
(45) Date of Patent: Nov. 20, 2012

(54) METHOD OF PATTERNING A LOW-K DIELECTRIC FILM

(75) Inventors: Yifeng Zhou, Fremont, CA (US); Srinivas D. Nemani, Sunnyvale, CA (US); Khoi Doan, San Jose, CA (US); Jeremiah T. P. Pender, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 22 days.

(21) Appl. No.: 13/070,913

(22) Filed: Mar. 24, 2011

(65) Prior Publication Data

US 2012/0077344 A1    Mar. 29, 2012

Related U.S. Application Data

(60) Provisional application No. 61/386,349, filed on Sep. 24, 2010.

(51) Int. Cl.
*H01L 21/302* (2006.01)

(52) U.S. Cl. ........ 438/707; 438/702; 438/706; 438/710; 438/711; 438/714; 438/743; 257/E21.214; 257/E21.218

(58) Field of Classification Search .................. None
See application file for complete search history.

(56) References Cited

U.S. PATENT DOCUMENTS

| 7,361,607 B2 * | 4/2008 | Yamaguchi et al. ........... 438/709 |
| 2009/0014414 A1 * | 1/2009 | Tomioka et al. ................. 216/41 |
| 2010/0233883 A1 * | 9/2010 | Nishimura et al. ........... 438/710 |

* cited by examiner

*Primary Examiner* — Charles Garber
*Assistant Examiner* — Yasser Abdelaziez
(74) *Attorney, Agent, or Firm* — Blakely Sokoloff Taylor Zafman LLP

(57) ABSTRACT

A significantly improved low-k dielectric patterning method is described herein using plasma comprising an oxygen radical source and a silicon source to remove the photo-resist layer.

10 Claims, 7 Drawing Sheets

METHOD OF PATTERNING A LOW-K DIELECTRIC FILM

CROSS-REFERENCE TO RELATED APPLICATIONS

This application claims the benefit of U.S. Provisional Application No. 61/386,349, filed Sep. 24, 2010, the entire contents of which are hereby incorporated by reference herein.

BACKGROUND

1) Field

Embodiments of the present invention pertain to the field of semiconductor processing and, in particular, to methods of patterning low-k dielectric films.

2) Description of Related Art

In semiconductor manufacturing, a low-k dielectric is a material with a small dielectric constant relative to silicon dioxide. Low-k dielectric material implementation is one of several strategies used to allow continued scaling of microelectronic devices. In digital circuits, insulating dielectrics separate the conducting parts (e.g., wire interconnects and transistors) from one another. As components have scaled and transistors have moved closer together, the insulating dielectrics have thinned to the point where charge build-up and crosstalk adversely affect the performance of the device. Replacing the silicon dioxide with a low-k dielectric of the same thickness reduces parasitic capacitance, enabling faster switching speeds and lower heat dissipation.

However, significant improvements are needed in the evolution of low-k dielectric technology.

SUMMARY

Embodiments of the present invention include methods of patterning low-k dielectric films.

In an embodiment, a method includes forming and patterning a photo-resist layer above a low-k dielectric layer, the low-k dielectric layer disposed above a substrate. The method also includes forming trenches in exposed portions of the low-k dielectric layer. The method also includes, subsequently, exposing the photo-resist layer to a plasma including an oxygen radical source and a silicon source to remove the photo-resist layer.

In another embodiment, a method includes forming and patterning a photo-resist layer above a low-k dielectric layer, the low-k dielectric layer disposed above a substrate. The method also includes forming trenches in exposed portions of the low-k dielectric layer. The method also includes, subsequently, soaking the low-k dielectric layer with a high boiling point silicon source. The method also includes, subsequently, exposing the photo-resist layer to a plasma including an oxygen radical source to remove the photo-resist layer.

DETAILED DESCRIPTION

Methods of patterning low-k dielectric films are described. In the following description, numerous specific details are set forth, such as chemical compositions of silicon sources and oxygen radical sources, in order to provide a thorough understanding of embodiments of the present invention. It will be apparent to one skilled in the art that embodiments of the present invention may be practiced without these specific details. In other instances, well-known aspects, such as photolithography patterning and development techniques for trench formation, are not described in detail in order to not unnecessarily obscure embodiments of the present invention. Furthermore, it is to be understood that the various embodiments shown in the Figures are illustrative representations and are not necessarily drawn to scale.

Porous low-k dielectric materials, e.g. porous SiCOH, are typically sensitive to plasma ashing. The sensitivity may arise from the chemical resemblance to an organic mask. As such, one key to reducing low-k dielectric ashing damage may be to improve selectivity between an organic mask and low-k dielectric material. The sensitivity may also arise from a high porosity which allows ashing chemistry to diffuse deep into low-k dielectric film.

Figures 1, 2:
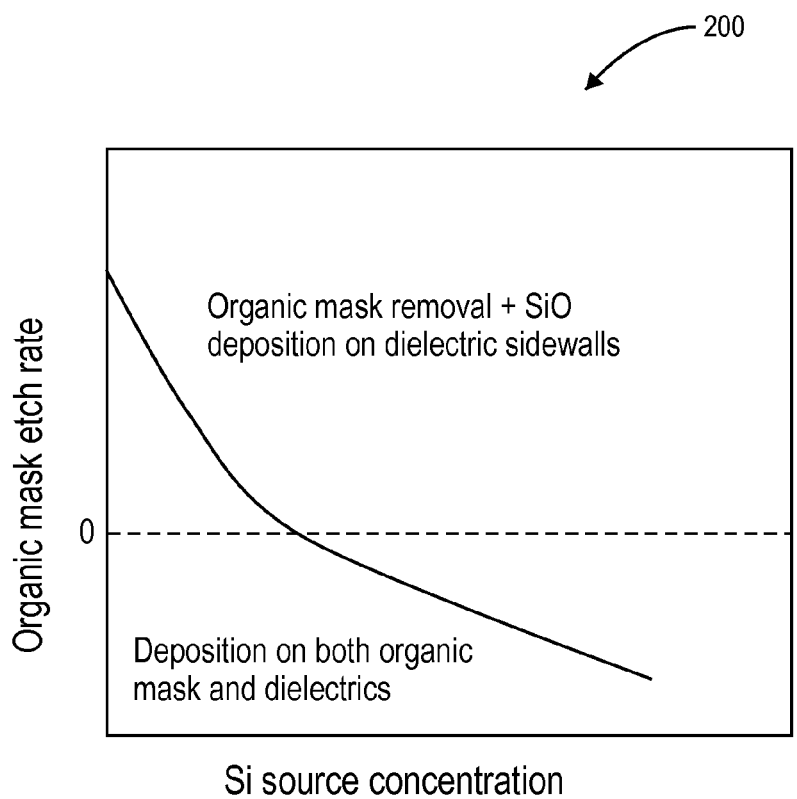
FIG. 1 is a plot of low-k ashing damage as a portion of critical dimension (CD).
FIG. 2 is a plot of ashing rate versus silicon (Si) source concentration, in accordance with an embodiment of the present invention.

Low-k dielectric ashing damage as a portion of critical dimension (CD) may need to be kept constant to maintain a same integrated k value as the CD decreases. Therefore, the absolute damage amount needs to decrease as technology progresses. FIG. 1 is a plot 100 of low-k ashing damage as a portion of critical dimension (CD). Referring to plot 100, critical dimension (CD; in nanometers, and representative of a given technology node) if compared against ashing damage per feature side (in nanometers) along with a corresponding percentage of CD. A review of plot 100 shows that ash optimization achieved for one technology is likely not sufficient for N+1 or N+2 technology nodes.

In accordance with an embodiment of the present invention, an ashing chemistry includes both an oxygen (O) radical source and a silicon (Si) source. When both the O radical source and the Si source are present in an ashing plasma, the ashing plasma removes an organic mask and, at the same time, deposits silicon oxide (e.g., SiOx) on a low-k dielectric film. The SiOx layer reduces exposure of the low k dielectric film to an ashing plasma and reduces ashing damage. The protective SiOx layer can be removed with a hydrofluoric acid (HF) solution. However, the amount of silicon source in the ashing plasma must be controlled, since an over abundance can lead to blocking of photo-resist removal selective to a low-k dielectric film. As an example of such blocking, FIG. 2 is a plot 200 of ashing rate versus silicon (Si) source concentration in an ashing plasma, in accordance with an embodiment of the present invention. Referring to FIG. 2, an over abundance of silicon source leads to deposition of silicon oxide on a photo-resist layer, inhibiting removal of the photo-resist layer. And, the etch rate actually falls below zero (i.e., more material grows than is removed) as deposition during plasma operation occurs. In an alternative to the embodiment described above, a silicon source is first formed on a low-k dielectric film and then an oxygen radical containing plasma is used to remove a photo-resist layer.

Figure 3:
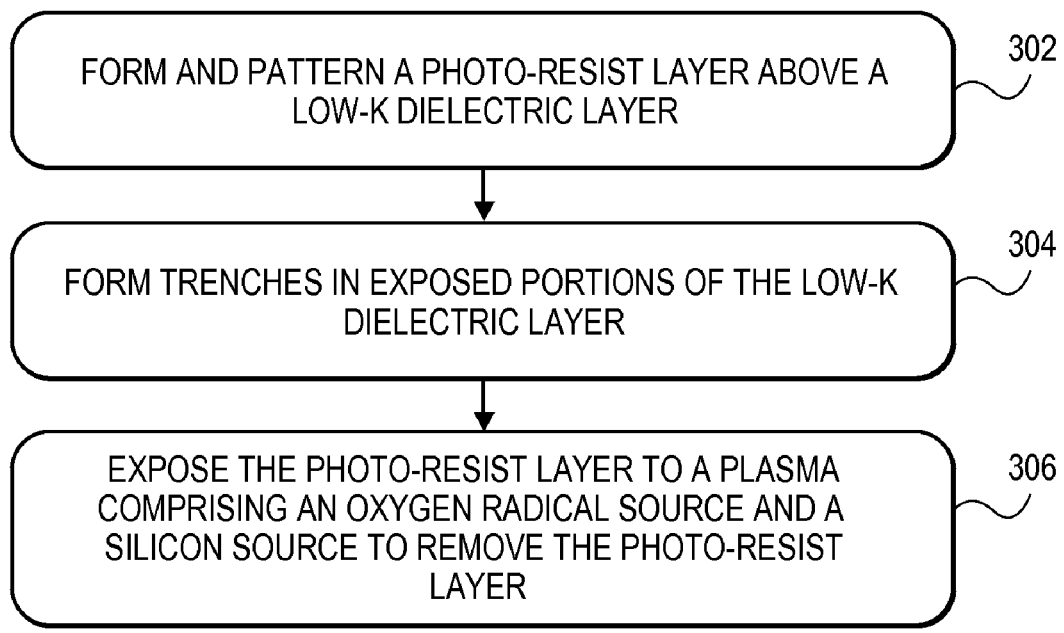
FIG. 3 is a Flowchart representing operations in a method of patterning a low-k dielectric film, in accordance with an embodiment of the present invention.

In an aspect of the present invention, a photo-resist layer may be removed in the presence of an exposed low-k dielectric film with a plasma having an oxygen radical source and a silicon source. For example, FIG. 3 is a Flowchart 300 representing operations in a method of patterning a low-k dielectric film, in accordance with an embodiment of the present invention. FIGS. 4A-4E illustrate cross-sectional views representing operations in a method of patterning a low-k dielectric film, in accordance with an embodiment of the present invention.

Figure 4A:
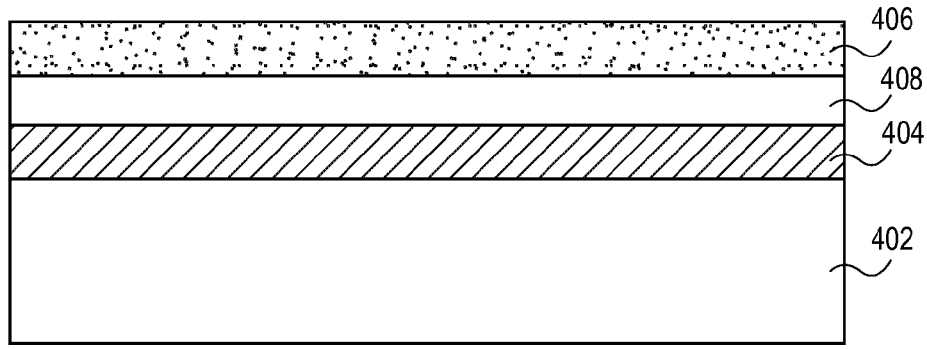
FIG. 4A illustrates a cross-sectional view representing an operation in a method of patterning a low-k dielectric film, in accordance with an embodiment of the present invention.
Figure 4B:
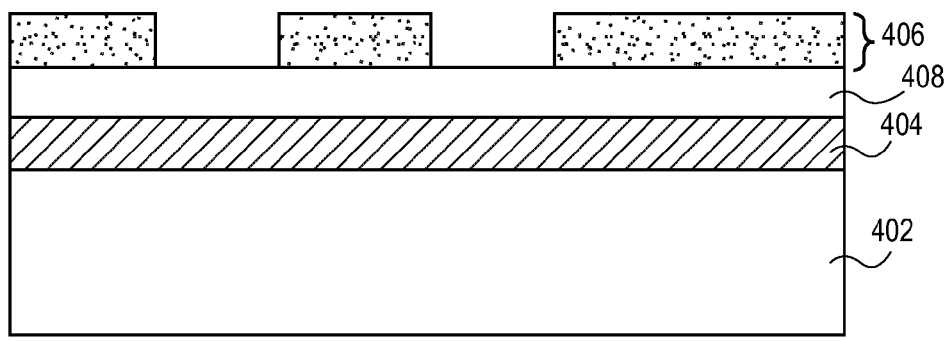
FIG. 4B illustrates a cross-sectional view representing an operation in a method of patterning a low-k dielectric film, in accordance with an embodiment of the present invention.

Referring to operation 302 of Flowchart 300 and corresponding FIGS. 4A and 4B, a method of patterning a low-k dielectric film includes forming (FIG. 4A) and patterning (FIG. 4B) a photo-resist layer 406 above a low-k dielectric layer 404, the low-k dielectric layer 404 disposed above a substrate 402. In an embodiment, a silicon dioxide layer 408 is disposed between the photo-resist layer 406 and the low-k dielectric layer 404, as depicted in FIGS. 4A and 4B and described in more detail below.

The photo-resist layer 406 may be composed of a material suitable for use in a lithographic process. That is, in an embodiment, the photo-resist layer 406 is exposed to a light source and subsequently developed. In one embodiment, the portions of the photo-resist layer 406 to be exposed to the light source will be removed upon developing the photo-resist layer 406, e.g., the photo-resist layer 406 is composed of a positive photo-resist material. In a specific embodiment, the photo-resist layer 406 is composed of a positive photo-resist material such as, but not limited to, a 248 nm resist, a 193 nm resist, a 157 nm resist, an extreme ultra-violet (EUV) resist, or a phenolic resin matrix with a diazonaphthoquinone sensitizer. In another embodiment, the portions of the photo-resist layer 406 to be exposed to the light source will be retained upon developing the photo-resist layer 406, e.g., the photo-resist layer 406 is composed of a negative photo-resist material. In a specific embodiment, the photo-resist layer 406 is composed of a negative photo-resist material such as, but not limited to, poly-cis-isoprene and poly-vinyl-cinnamate.

In an embodiment, the low-k dielectric layer 404 has a permittivity less than that of silicon dioxide, e.g., less than approximately 3.9. In one embodiment, the low-k dielectric layer 404 is a material such as, but not limited to, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric. In accordance with an embodiment of the present invention, the low-k dielectric layer 404 is a porous SiCOH layer having a dielectric constant of less than 2.7.

Substrate 402 may be composed of a material suitable to withstand a fabrication process and upon which semiconductor processing layers may suitably reside. In accordance with an embodiment of the present invention, substrate 402 is composed of a group IV-based material such as, but not limited to, crystalline silicon, germanium or silicon/germanium. In a specific embodiment, providing substrate 402 includes providing a monocrystalline silicon substrate. In a particular embodiment, the monocrystalline silicon substrate is doped with impurity atoms. In another embodiment, substrate 402 is composed of a III-V material. In an embodiment, a plurality of semiconductor devices reside on substrate 402, below low-k dielectric layer 404.

Figure 4C:
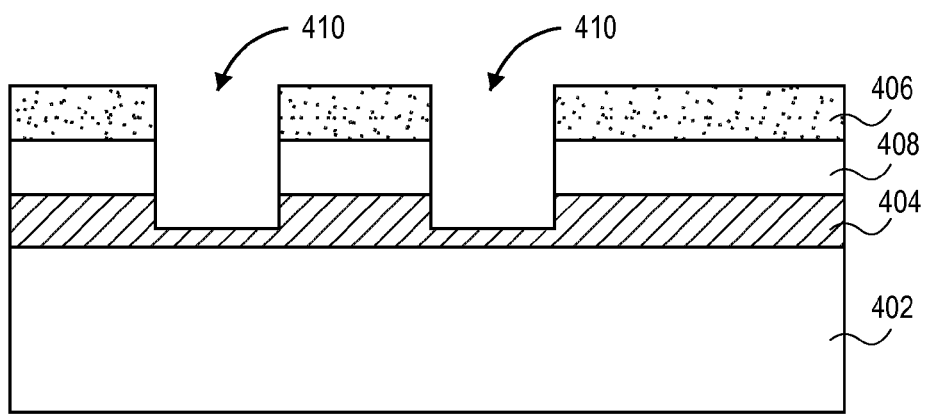
FIG. 4C illustrates a cross-sectional view representing an operation in a method of patterning a low-k dielectric film, in accordance with an embodiment of the present invention.

Referring to operation 304 of Flowchart 300 and corresponding FIG. 4C, the method of patterning the low-k dielectric film also includes forming trenches 410 in exposed portions of the low-k dielectric layer 404. In accordance with an embodiment of the present invention, forming the trenches 410 in exposed portions of the low-k dielectric layer 404 includes forming the trenches 410 into, but not entirely through, the low-k dielectric layer 404, as depicted in FIG. 4C. In another embodiment, not depicted, forming the trenches 410 in exposed portions of the low-k dielectric layer 404 includes forming the trenches 410 entirely through the low-k dielectric layer 404.

Referring to operation 306 of Flowchart 300 and corresponding FIG. 4D, the method of patterning the low-k dielectric film also includes, subsequently, exposing the photo-resist layer 406 to a plasma having an oxygen radical source and a silicon source to remove the photo-resist layer 406.

Figure 4D:
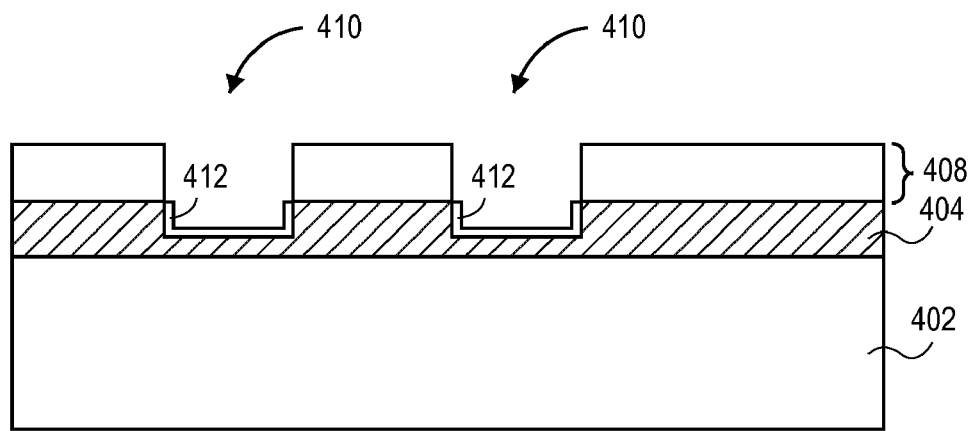
FIG. 4D illustrates a cross-sectional view representing an operation in a method of patterning a low-k dielectric film, in accordance with an embodiment of the present invention.

In accordance with an embodiment of the present invention, exposing the photo-resist layer 406 to the plasma includes forming a silicon oxide layer 412 on the low-k dielectric layer 404, as depicted in FIG. 4D. In an embodiment, the oxygen radical source is a molecule with a dissociation product composed of an oxygen radical, the oxygen radical source a source such as, but not limited to, oxygen ($O_2$), ozone ($O_3$), carbon dioxide ($CO_2$), or water ($H_2O$). In an embodiment, the silicon source is a molecule that reacts with an oxygen radical to form the silicon oxide layer 412 on the low-k dielectric layer 404, the silicon source a source such as, but not limited to, silicon tetrafluoride ($SiF_4$), silicon tetrachloride ($SiCl_4$), silane ($SiH_4$), dimethylsilane (($CH_3)_2SiH_2$), trimethylsilane (($CH_3)_3SiH$), or N-(Trimethylsilyl)dimethylamine (($CH_3)_3SiN(CH_2)_2$). In an embodiment, exposing the photo-resist layer 406 to the plasma includes using an ash chamber. In an embodiment, prior to exposing the photo-resist layer 406 to the plasma the low-k dielectric layer 404 has a first dielectric constant, and subsequent to exposing the photo-resist layer 406 to the plasma the low-k dielectric layer 404 has a second dielectric constant less than 0.1 greater than the first dielectric constant.

Figure 4E:
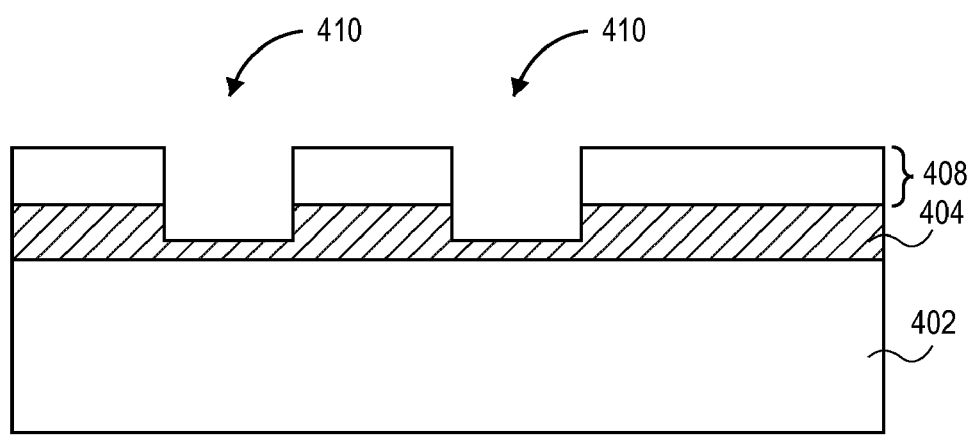
FIG. 4E illustrates a cross-sectional view representing an operation in a method of patterning a low-k dielectric film, in accordance with an embodiment of the present invention.

Referring to FIG. 4E, in accordance with an embodiment of the present invention, the method of patterning the low-k dielectric film further includes, subsequent to exposing the photo-resist layer 406 to the plasma, treating the low-k dielectric layer 404 to a wet etch solution including hydrofluoric acid (HF), the treating including removing the silicon oxide layer 412. In an embodiment, forming and patterning the photo-resist layer 406 above the low-k dielectric layer 404 includes forming and patterning the photo-resist layer 406 on a silicon dioxide layer 408 disposed on the low-k dielectric layer 404. In that embodiment, forming the trenches 410 in exposed portions of the low-k dielectric layer includes also forming trenches in exposed portions of the silicon dioxide layer 408, as depicted in FIG. 4C, and treating the low-k dielectric layer 404 to the wet etch solution includes removing a portion of, but not all of, the silicon dioxide layer 408. In another embodiment, not depicted, treating the low-k dielectric layer 404 to the wet etch solution includes removing all of the silicon dioxide layer 408.

Figure 5:
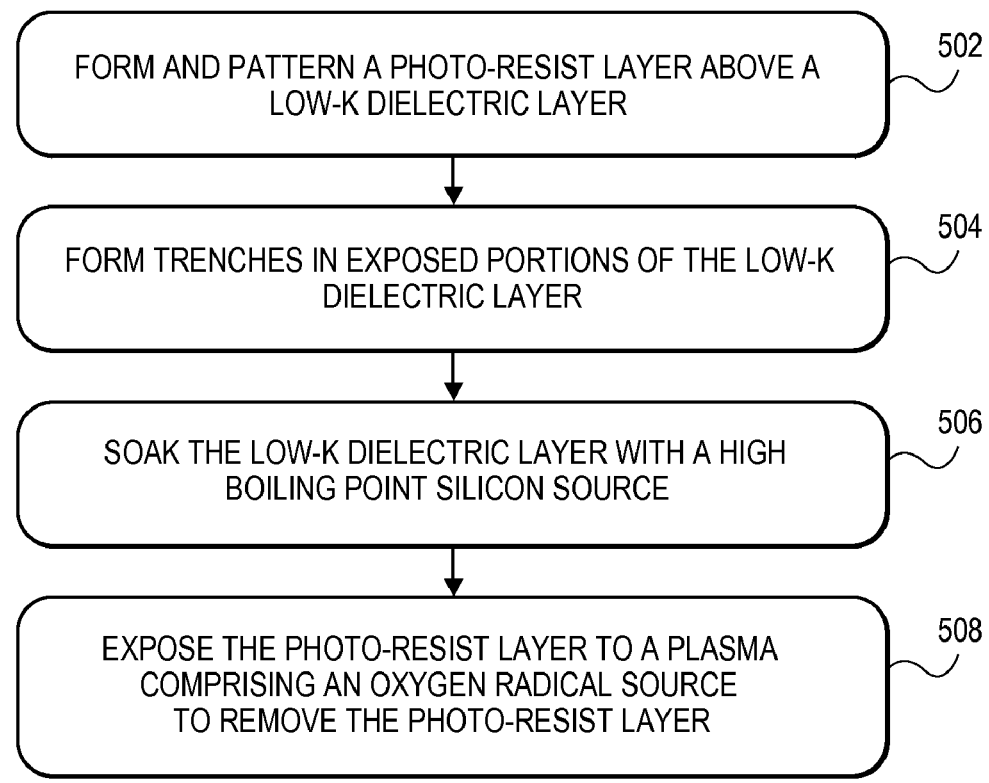
FIG. 5 is a Flowchart representing operations in a method of patterning a low-k dielectric film, in accordance with an embodiment of the present invention.

In another aspect of the present invention, a photo-resist layer may be removed in the presence of an exposed low-k dielectric film by first treating the low-k dielectric film with a silicon source and then with a plasma having an oxygen radical source. For example, FIG. 5 is a Flowchart 500 representing operations in a method of patterning a low-k dielectric film, in accordance with an embodiment of the present invention. FIGS. 6A-6F illustrate cross-sectional views representing operations in a method of patterning a low-k dielectric film, in accordance with an embodiment of the present invention.

Figure 6A:
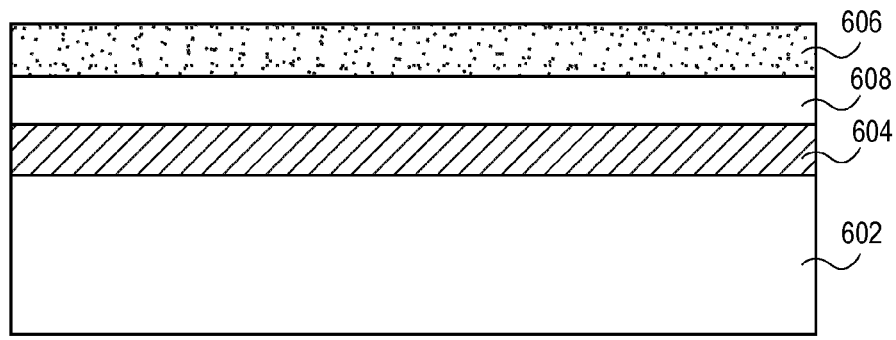
FIG. 6A illustrates a cross-sectional view representing an operation in a method of patterning a low-k dielectric film, in accordance with an embodiment of the present invention.
Figure 6B:
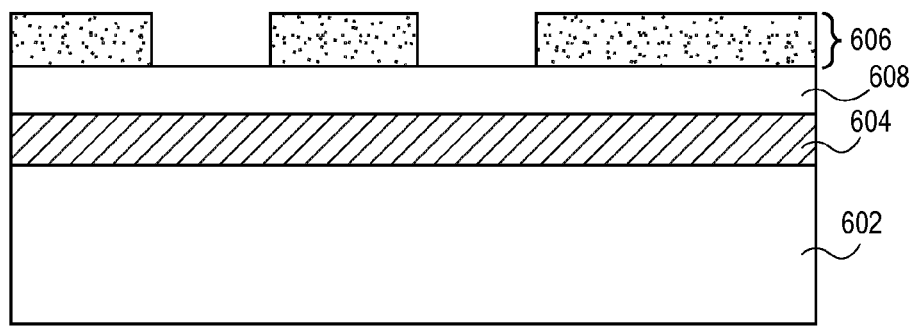
FIG. 6B illustrates a cross-sectional view representing an operation in a method of patterning a low-k dielectric film, in accordance with an embodiment of the present invention.

Referring to operation 502 of Flowchart 500 and corresponding FIGS. 6A and 6B, a method of patterning a low-k dielectric film includes forming (FIG. 6A) and patterning (FIG. 6B) a photo-resist layer 606 above a low-k dielectric layer 604, the low-k dielectric layer 604 disposed above a substrate 602. In an embodiment, a silicon dioxide layer 608 is disposed between the photo-resist layer 606 and the low-k dielectric layer 604, as depicted in FIGS. 6A and 6B and described in more detail below.

The photo-resist layer 606 may be composed of a material suitable for use in a lithographic process. That is, in an embodiment, the photo-resist layer 606 is exposed to a light source and subsequently developed. In one embodiment, the portions of the photo-resist layer 606 to be exposed to the light source will be removed upon developing the photo-resist layer 606, e.g., the photo-resist layer 606 is composed of a positive photo-resist material. In a specific embodiment, the photo-resist layer 606 is composed of a positive photo-resist material such as, but not limited to, a 248 nm resist, a 193 nm resist, a 157 nm resist, an extreme ultra-violet (EUV) resist, or a phenolic resin matrix with a diazonaphthoquinone sensitizer. In another embodiment, the portions of the photo-resist layer 606 to be exposed to the light source will be retained upon developing the photo-resist layer 606, e.g., the photo-resist layer 606 is composed of a negative photo-resist material. In a specific embodiment, the photo-resist layer 606 is composed of a negative photo-resist material such as, but not limited to, poly-cis-isoprene and poly-vinyl-cinnamate.

In an embodiment, the low-k dielectric layer 604 has a permittivity less than that of silicon dioxide, e.g., less than approximately 3.9. In one embodiment, the low-k dielectric layer 604 is a material such as, but not limited to, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric. In accordance with an embodiment of the present invention, the low-k dielectric layer 604 is a porous SiCOH layer having a dielectric constant of less than 2.7.

Substrate 602 may be composed of a material suitable to withstand a fabrication process and upon which semiconductor processing layers may suitably reside. In accordance with an embodiment of the present invention, substrate 602 is composed of a group IV-based material such as, but not limited to, crystalline silicon, germanium or silicon/germanium. In a specific embodiment, providing substrate 602 includes providing a monocrystalline silicon substrate. In a particular embodiment, the monocrystalline silicon substrate is doped with impurity atoms. In another embodiment, substrate 602 is composed of a material. In an embodiment, a plurality of semiconductor devices reside on substrate 602, below low-k dielectric layer 604.

Figure 6C:
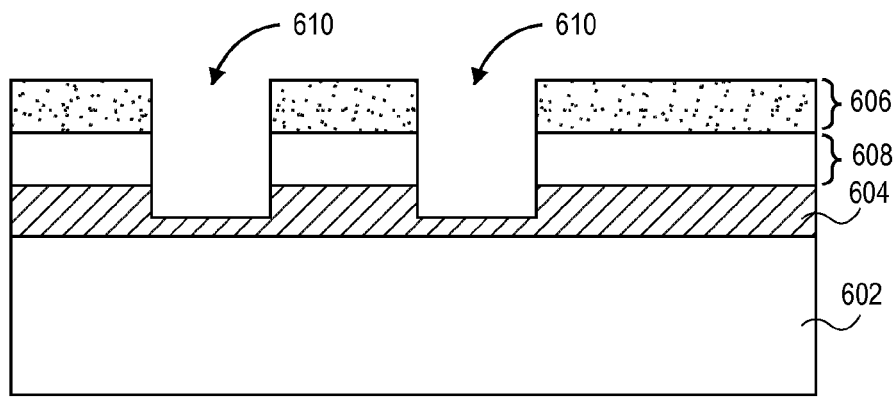
FIG. 6C illustrates a cross-sectional view representing an operation in a method of patterning a low-k dielectric film, in accordance with an embodiment of the present invention.

Referring to operation 504 of Flowchart 500 and corresponding FIG. 6C, the method of patterning the low-k dielectric film also includes forming trenches 610 in exposed portions of the low-k dielectric layer 604. In accordance with an embodiment of the present invention, forming the trenches 610 in exposed portions of the low-k dielectric layer 604 includes forming the trenches 610 into, but not entirely through, the low-k dielectric layer 604, as depicted in FIG. 6C. In another embodiment, not depicted, forming the trenches 610 in exposed portions of the low-k dielectric layer 604 includes forming the trenches 610 entirely through the low-k dielectric layer 604.

Figure 6D:
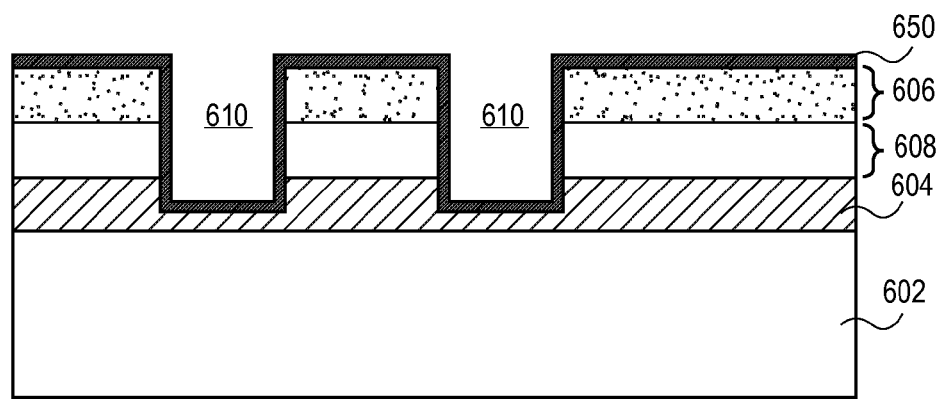
FIG. 6D illustrates a cross-sectional view representing an operation in a method of patterning a low-k dielectric film, in accordance with an embodiment of the present invention.

Referring to operation 506 of Flowchart 500 and corresponding FIG. 6D, the method of patterning the low-k dielectric film also includes soaking the low-k dielectric layer 604 with a high boiling point silicon source 650. In accordance with an embodiment of the present invention, the high boiling point silicon source 650 is a molecule that can be later used to react with an oxygen radical to form a silicon oxide layer on the low-k dielectric layer. In one embodiment, the high boiling point silicon source is composed of N-(Trimethylsilyl) dimethylamine (($CH_3$)$_3$SiN($CH_2$)$_2$).

Referring to operation 508 of Flowchart 500 and corresponding FIG. 6E, the method of patterning the low-k dielectric film also includes, subsequently, exposing the photo-resist layer 606 to a plasma including an oxygen radical source to remove the photo-resist layer 606.

Figure 6E:
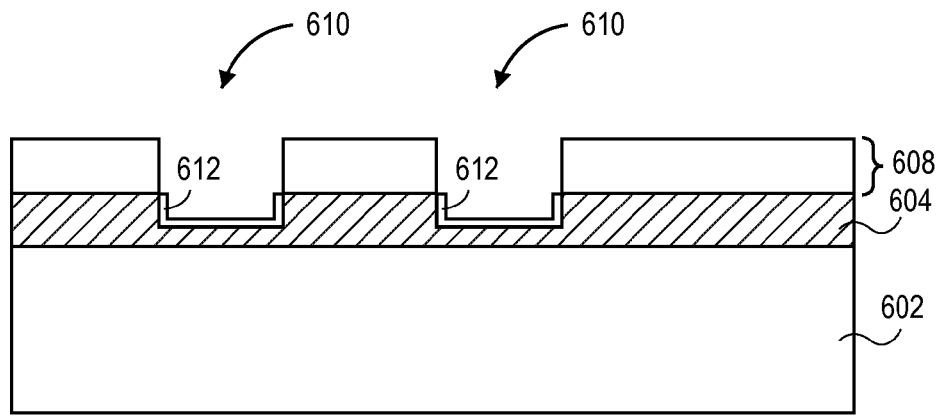
FIG. 6E illustrates a cross-sectional view representing an operation in a method of patterning a low-k dielectric film, in accordance with an embodiment of the present invention.

In accordance with an embodiment of the present invention, exposing the photo-resist layer 606 to the plasma includes forming a silicon oxide layer 612 on the low-k dielectric layer 604, as depicted in FIG. 6E. In an embodiment, the oxygen radical source is a molecule with a dissociation product composed of an oxygen radical, the oxygen radical source a source such as, but not limited to, oxygen ($O_2$), ozone ($O_3$), carbon dioxide ($CO_2$), or water ($H_2O$). In an embodiment, exposing the photo-resist layer 606 to the plasma includes using an ash chamber. In an embodiment, prior to exposing the photo-resist layer 606 to the plasma the low-k dielectric layer 604 has a first dielectric constant, and subsequent to exposing the photo-resist layer 606 to the plasma the low-k dielectric layer 604 has a second dielectric constant less than 0.1 greater than the first dielectric constant.

Figure 6F:
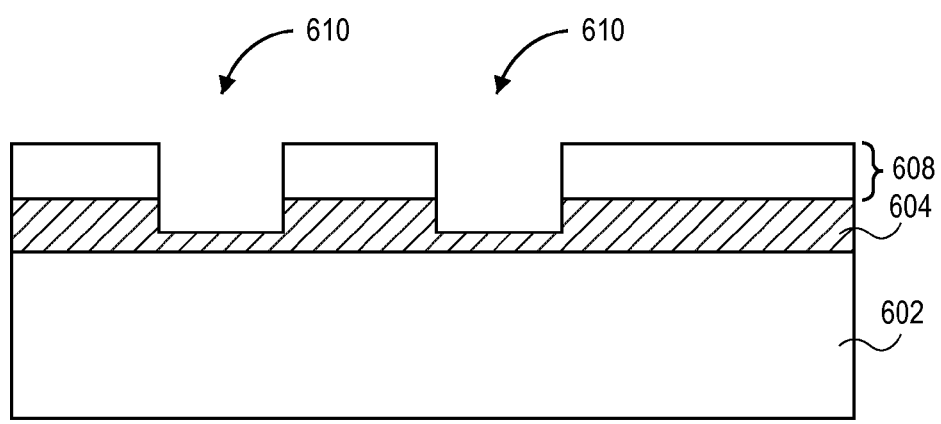
FIG. 6F illustrates a cross-sectional view representing an operation in a method of patterning a low-k dielectric film, in accordance with an embodiment of the present invention.

Referring to FIG. 6F, in accordance with an embodiment of the present invention, the method of patterning the low-k dielectric film further includes, subsequent to exposing the photo-resist layer 606 to the plasma, treating the low-k dielectric layer 604 to a wet etch solution including hydrofluoric acid (HF), the treating including removing the silicon oxide layer 612. In an embodiment, forming and patterning the photo-resist layer 606 above the low-k dielectric layer 604 includes forming and patterning the photo-resist layer 606 on a silicon dioxide layer 608 disposed on the low-k dielectric layer 604. In that embodiment, forming the trenches 610 in exposed portions of the low-k dielectric layer includes also forming trenches in exposed portions of the silicon dioxide layer 608, as depicted in FIG. 6C, and treating the low-k dielectric layer 604 to the wet etch solution includes removing a portion of, but not all of, the silicon dioxide layer 608. In another embodiment, not depicted, treating the low-k dielectric layer 604 to the wet etch solution includes removing all of the silicon dioxide layer 608.

Thus, methods of patterning low-k dielectric films have been disclosed. In accordance with an embodiment of the present invention, a method includes forming and patterning a photo-resist layer above a low-k dielectric layer, the low-k dielectric layer disposed above a substrate. Trenches are formed in exposed portions of the low-k dielectric layer. Subsequently, the photo-resist layer is exposed to a plasma including an oxygen radical source and a silicon source to remove the photo-resist layer. In one embodiment, exposing the photo-resist layer to the plasma includes forming a silicon oxide layer on the low-k dielectric layer. In accordance with another embodiment of the present invention, a method includes forming and patterning a photo-resist layer above a low-k dielectric layer, the low-k dielectric layer disposed above a substrate. Trenches are formed in exposed portions of the low-k dielectric layer. Subsequently, the low-k dielectric layer is soaked with a high boiling point silicon source. Subsequently, the photo-resist layer is exposed to a plasma including an oxygen radical source to remove the photo-resist layer. In one embodiment, the high boiling point silicon source is a molecule that reacts with an oxygen radical to form a silicon oxide layer on the low-k dielectric layer, the high boiling point silicon source composed of N-(Trimethylsilyl) dimethylamine (($CH_3$)$_3$SiN($CH_2$)$_2$).

What is claimed is:

1. A method of patterning a low-k dielectric film, the method comprising:
   forming and patterning a photo-resist layer above a low-k dielectric layer, the low-k dielectric layer disposed above a substrate;
   forming trenches in exposed portions of the low-k dielectric layer; and, subsequently,
   exposing the photo-resist layer to a plasma comprising an oxygen radical source and a silicon source to remove the photo-resist layer.

2. The method of claim 1, wherein exposing the photo-resist layer to the plasma comprises forming a silicon oxide layer on the low-k dielectric layer.

3. The method of claim 1, wherein the oxygen radical source is a molecule with a dissociation product comprising an oxygen radical, the oxygen radical source selected from the group consisting of oxygen ($O_2$), ozone ($O_3$), carbon dioxide ($CO_2$), and water ($H_2O$).

4. The method of claim 1, wherein the silicon source is a molecule that reacts with an oxygen radical to form a silicon oxide layer on the low-k dielectric layer, the silicon source selected from the group consisting of silicon tetrafluoride ($SiF_4$), silicon tetrachloride ($SiCl_4$), silane ($SiH_4$), dimethylsilane (($CH_3$)$_2$$SiH_2$), trimethylsilane (($CH_3$)$_3$SiH), and N-(Trimethylsilyl)dimethylamine (($CH_3$)$_3$SiN($CH_2$)$_2$).

5. The method of claim 1, wherein exposing the photo-resist layer to the plasma comprises using an ash chamber.

6. The method of claim 1, wherein prior to exposing the photo-resist layer to the plasma the low-k dielectric layer has a first dielectric constant, and subsequent to exposing the photo-resist layer to the plasma the low-k dielectric layer has a second dielectric constant less than 0.1 greater than the first dielectric constant.

7. The method of claim 1, further comprising:
   subsequent to exposing the photo-resist layer to the plasma, treating the low-k dielectric layer to a wet etch solution comprising hydrofluoric acid (HF), the treating comprising removing the silicon oxide layer.

8. The method of claim 7, wherein forming and patterning the photo-resist layer above the low-k dielectric layer comprises forming and patterning the photo-resist layer on a silicon dioxide layer disposed on the low-k dielectric layer, wherein forming trenches in exposed portions of the low-k dielectric layer comprises also forming trenches in exposed portions of the silicon dioxide layer, and wherein treating the low-k dielectric layer to the wet etch solution comprises removing a portion of, or all of, the silicon dioxide layer.

9. The method of claim 1, wherein forming trenches in exposed portions of the low-k dielectric layer comprises forming trenches partially or entirely through the low-k dielectric layer.

10. The method of claim 1, wherein the low-k dielectric layer is a porous SiCOH layer having a dielectric constant of less than 2.7.

* * * * *